United States Patent
Song et al.

(10) Patent No.: US 9,947,739 B2
(45) Date of Patent: Apr. 17, 2018

(54) DISPLAY DEVICE ARRAY SUBSTRATE WITHOUT FRAME

(71) Applicant: BOE TECHNOLOGY GROUP CO., LTD., Beijing (CN)

(72) Inventors: Song Song, Beijing (CN); Kazuyoshi Nagayama, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/787,614

(22) PCT Filed: Dec. 12, 2014

(86) PCT No.: PCT/CN2014/093739
§ 371 (c)(1),
(2) Date: Oct. 28, 2015

(87) PCT Pub. No.: WO2016/041272
PCT Pub. Date: Mar. 24, 2016

(65) Prior Publication Data
US 2016/0086533 A1 Mar. 24, 2016

(30) Foreign Application Priority Data
Sep. 16, 2014 (CN) .......................... 2014 1 0472219

(51) Int. Cl.
*H01L 27/32* (2006.01)
*H01L 51/00* (2006.01)

(52) U.S. Cl.
CPC ...... *H01L 27/3293* (2013.01); *H01L 27/3297* (2013.01); *H01L 51/0097* (2013.01); *H01L 2251/5338* (2013.01); *Y02E 10/549* (2013.01)

(58) Field of Classification Search
CPC .. G09G 3/3677; G09G 3/3225; G09G 3/3648; G09G 2300/0408; G09G 2310/08; G09G 2310/0281; G09G 2330/021
See application file for complete search history.

(56) References Cited

U.S. PATENT DOCUMENTS 6,801,292 B2 * 10/2004 Sato ...................... C09K 19/02
349/182
8,471,981 B2 * 6/2013 Kim .................... G02F 1/13336
349/151

(Continued)

FOREIGN PATENT DOCUMENTS

CN 101261413 A 9/2008
CN 201429938 Y 3/2010

(Continued)

OTHER PUBLICATIONS

International Search Report and Written Opinion both dated Jul. 13, 2015; PCT/CN2014/093739.

(Continued)

*Primary Examiner* — Nalini Mummalaneni
(74) *Attorney, Agent, or Firm* — Ladas & Parry LLP; Loren K. Thompson

(57) ABSTRACT

An array substrate and a display device are provided. The array substrate includes: a gate driving circuit, no pixel electrode layer being provided on a position of the array substrate corresponding to the gate driving circuit, the array substrate being made of a flexible material, wherein, the gate driving circuit is disposed on a position of a central axis of the array substrate and extends along a direction of the central axis; the gate driving circuit is configured for providing a driving signal to a gate line of the array substrate.

13 Claims, 4 Drawing Sheets

(56) References Cited

U.S. PATENT DOCUMENTS

| | | | | |
|---|---|---|---|---|
| 2001/0002145 A1* | 5/2001 | Lee | ............... | G02F 1/133308 |
| | | | | 349/58 |
| 2006/0044215 A1* | 3/2006 | Brody | ............... | G06F 3/1446 |
| | | | | 345/1.3 |
| 2009/0103002 A1 | 4/2009 | Enomoto | | |
| 2010/0065832 A1* | 3/2010 | Sugimoto | ........... | H01L 27/3293 |
| | | | | 257/40 |
| 2012/0194773 A1 | 8/2012 | Kim et al. | | |
| 2014/0175446 A1* | 6/2014 | Xu | ............... | H01L 27/1255 |
| | | | | 257/71 |

FOREIGN PATENT DOCUMENTS

| | | |
|---|---|---|
| CN | 102751308 A | 10/2012 |
| CN | 102983155 A | 3/2013 |
| WO | 2014/135847 A2 | 9/2014 |

OTHER PUBLICATIONS

Second Chinese Office Action dated Nov. 28, 2016; Appln. No. 201410472219.1.
First Chinese Office Action dated Aug. 2, 2016; Appln. No. 201410472219.1.
The Third Chinese Office Action dated Jun. 1, 2017; Appln. No. 201410472219.1.
The Extended European Search Report dated Feb. 15, 2018; Appln. No. 14885845.9.

* cited by examiner

DISPLAY DEVICE ARRAY SUBSTRATE WITHOUT FRAME

TECHNICAL FIELD

Embodiments of the present disclosure relate to an array substrate and a display device.

BACKGROUND

An Organic Light-Emitting Diode (OLED) is a current light-emitting device based on organic materials. With development of science and technology, the OLED gradually becomes an emerging application technology of a next generation of flat panel display. Due to requirements on production processes of sealant and wiring, each OLED module in an existing OLED display device in addition to a display region also has a certain frame scope.

With continually updated technology and improvement of user requirements, the existing OLED display device with frame cannot meet people's needs. Due to existence of the frame, the existing OLED display device will have a problem that the image cannot be displayed on a position of the frame, influencing a viewing effect of users. Meanwhile, when a large-sized display screen is produced, a plurality of small-sized display screens need to be spliced together, which will inevitably form un-displayable splicing gap, split screen, and destroy continuity of images, and seriously affect an overall effect of a display picture.

SUMMARY

According to an embodiment of the disclosure, an array substrate is provided, the array substrate comprising: a gate driving circuit, no pixel electrode layer being provided on a position of the array substrate corresponding to the gate driving circuit, wherein, the array substrate is made of a flexible material; the gate driving circuit is disposed on a position of a central axis of the array substrate and extends along a direction of the central axis; the gate driving circuit is configured for providing a driving signal to a gate line of the array substrate.

In one example, the array substrate further comprises a source driving circuit, and no pixel electrode layer is provided on a position of the array substrate corresponding to the source driving circuit; the source driving circuit is disposed on a position of another central axis of the array substrate, which is perpendicular to an extending direction of the gate driving circuit, and extends along a direction of the another central axis; the source driving circuit is configured for providing a driving signal to a data line of the array substrate.

In one example, the gate driving circuit is a Gate Driver On Array (GOA).

In one example, the array substrate further comprises a Chip On Film (COF); the gate driving circuit is disposed on a Printed Circuit Board (PCB); the COF is disposed on a position between the PCB and the array substrate.

In one example, the source driving circuit is an independent source driver.

In one example, the array substrate further comprises a Chip On Film (COF); the source driving circuit is disposed on a Printed Circuit Board (PCB); the COF is disposed on a position between the PCB and the array substrate.

In one example, a portion of the array substrate corresponding to the gate driving circuit bends toward one side of the array substrate, so that portions of the array substrate, which are located on both sides of the gate driving circuit, are in contact with each other.

In one example, a portion of the array substrate corresponding to the source driving circuit bends toward one side of the array substrate, so that portions of the array substrate, which are located on both sides of the source driving circuit, are in contact with each other.

According to another embodiment of the present disclosure, there is provided a display device, comprising the array substrate according to any embodiment of the present disclosure.

According to yet another embodiment of the present disclosure, there is provided an display device, comprising at least four array substrates spliced together, each array substrate having a gate driving circuit and a source driving circuit, wherein, the gate driving circuit of each array substrate is disposed on a position between two array substrates and extends along edges of the array substrates on both sides of the gate driving circuit; the source driving circuit of each array substrate is arranged to extend in a direction perpendicular to an extending direction of the gate driving circuit and is located on a position between two array substrates.

In one example, the gate driving circuit is a Gate Driver On Array (GOA); the source driving circuit is an independent source driver.

In one example, the gate driving circuit and the source driving circuit are disposed on a Printed Circuit Board (PCB), respectively; the PCB is connected with the array substrates in the display device through a Chip On Film (COF), respectively.

In one example, a portion of the array substrates corresponding to the gate driving circuit bends toward one side of the array substrates, so that portions of the array substrates, which are located on both sides of the gate driving circuit, are in contact with each other; a portion of the array substrates corresponding to the source driving circuit bends toward one side of the array substrates, so that portions of the array substrates, which are located on both sides of the source driving circuit, are in contact with each other.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
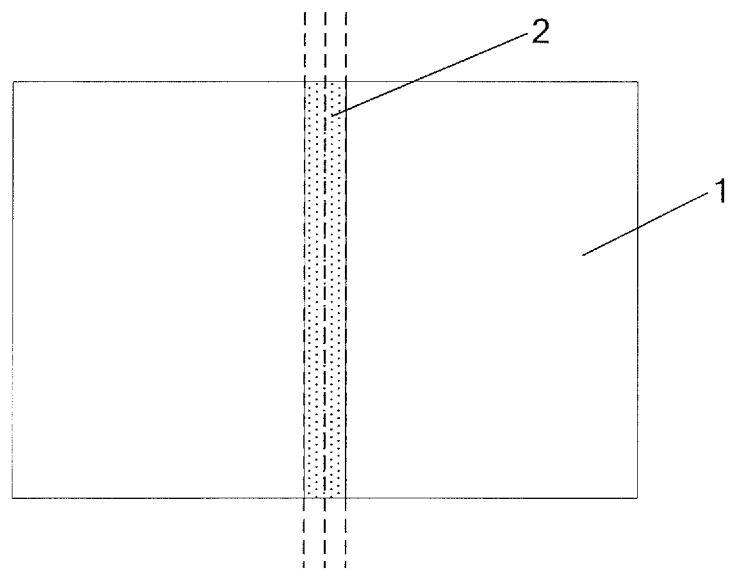
FIG. 1 is a structural schematic diagram of an array substrate provided by an embodiment of the disclosure.

An embodiment of the disclosure provides an array substrate 1, referring to FIG. 1, the array substrate 1 comprising a gate driving circuit 2, the array substrate 1 being made of a flexible material.

The gate driving circuit 2 is disposed on a position of a central axis of the array substrate 1 and extends along a direction of the central axis.

The gate driving circuit 2 is configured for providing a driving signal to a gate line (not illustrated) of the array substrate 1.

The gate driving circuit is generally disposed on a position of the central axis of the array substrate, which is perpendicular to an extending direction of the gate line, and extends along a direction of the central axis. It should be noted that there is no pixel electrode layer on a position where the array substrate is located. The array substrate can, as illustrated in FIG. 1, adopt a method that the whole array substrate is driven by one gate driving circuit, to implement that one gate driving circuit provides driving signals to gate lines of the whole array substrate. Of course, since a clock signal of the gate driving circuit is limited, a method, as illustrated in FIG. 2, can be adopted, that is, the gate lines on the left and right sides of the whole array substrate can be driven in separate way, to implement that two gate driving circuits provide driving signals to the gate lines on the left and right sides of the whole array substrate, respectively.

Figure 2:
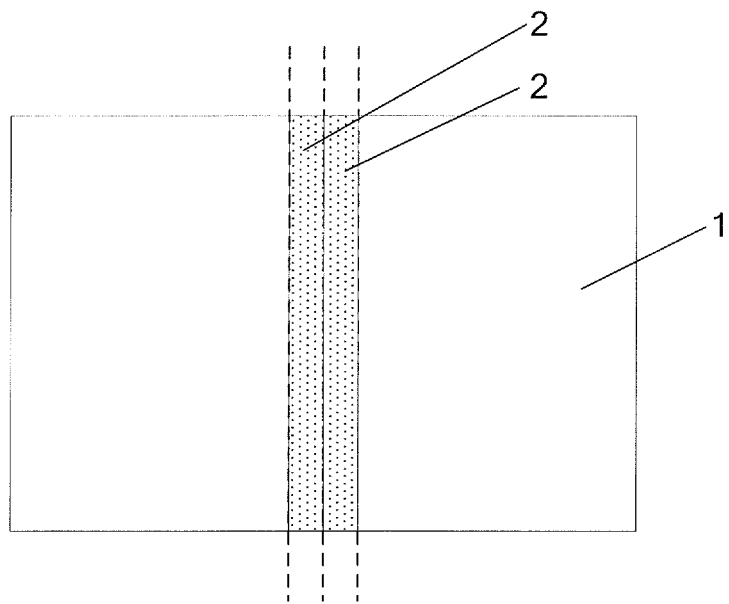
FIG. 2 is a structural schematic diagram of another array substrate provided by the embodiment of the disclosure.

In the structures as illustrated in FIG. 1 and FIG. 2, the array substrate of the present embodiment is made of a flexible material, and meanwhile the gate driving circuit is located on a position in the middle of the whole array substrate. In practical design, the gate driving circuit can bend downwards along a position of a dotted line illustrated in FIG. 1 and FIG. 2, so that the substrates on the left and right sides can get close together, and the display device finally formed will not show a situation that the middle potion cannot display; meanwhile the gate driving circuit is disposed in the middle of the substrate rather than in the periphery, so that the display device finally formed can implement uninterrupted continuous display of images in a case of no frame. Even if, when it is necessary to make a large-sized display screen, a plurality of array substrates are spliced together to form the large-sized display screen provided by the embodiment of the disclosure, since there is no driving circuit on edges of all the array substrates, the large-sized display device finally formed will not have splicing gap, and thus the problems such as split screen and discontinuous images, will not appear.

As for the array substrate provided by the embodiment of the disclosure, the array substrate is made of a flexible material, and the gate driving circuit is disposed on a position of a central axis of a pattern of the array substrate, so that it is not necessary to fabricate the driving circuit in the periphery region of the array substrate or fabricate a frame for the array substrate, which solves the problems such as the frame existed in the display, the split screen and discontinuous images of the large-sized display screen after splicing in the prior art, implements a frameless design of the display device, and meanwhile implements a seamless splicing of the large-sized display screen, and improves the viewing effect of users and the overall display effect of images.

Figure 3:
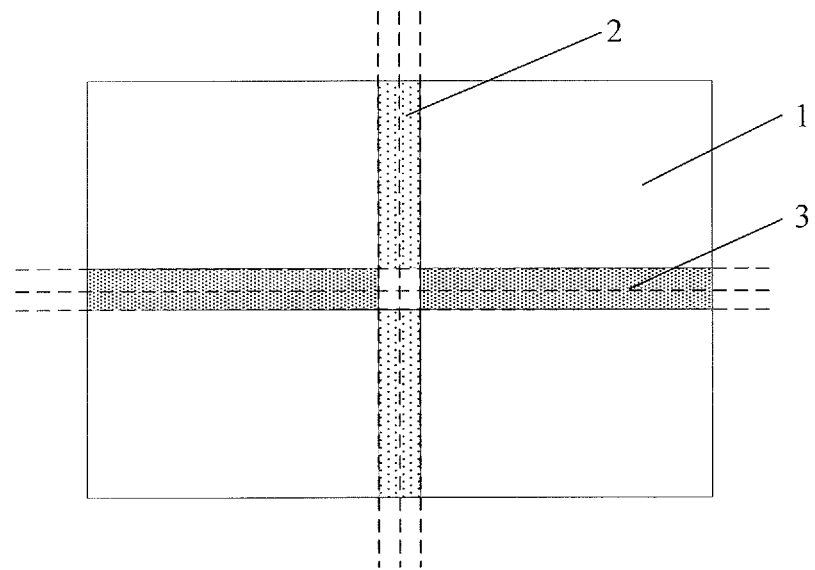
FIG. 3 is a structural schematic diagram of yet another array substrate provided by the embodiment of the disclosure.

Further, referring to FIG. 3, the array substrate further comprises a source driving circuit 3, and no pixel electrode layer is provided on a position of the array substrate corresponding to the source driving circuit.

The source driving circuit 3 is disposed on a position of the central axis of the pattern of the array substrate, which is perpendicular to an extending direction of the gate driving circuit.

The source driving circuit 3 is configured for providing a driving signal to a data line (not illustrated) of the array substrate 1.

Figure 4:
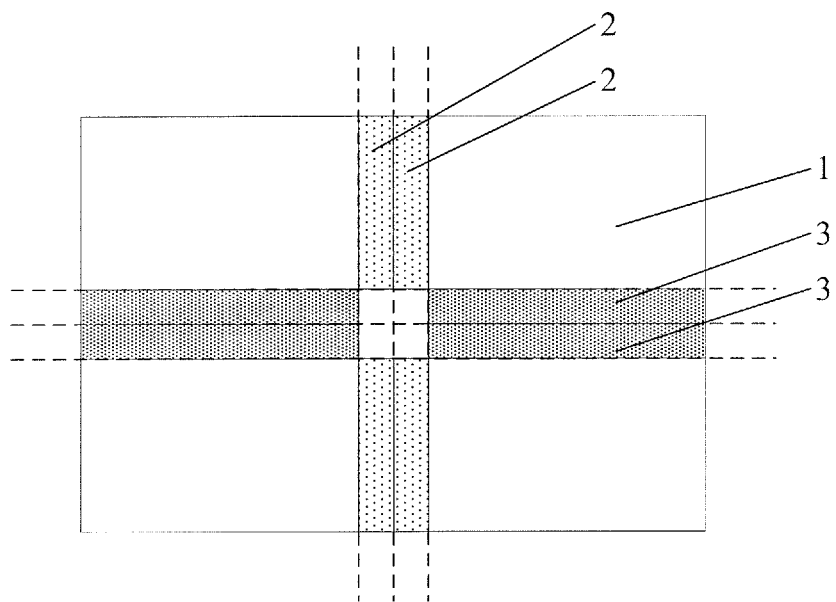
FIG. 4 is a structural schematic diagram of an array substrate provided by another embodiment of the disclosure.

In the practical design, the source driving circuit is generally designed on a position of a central axis which is perpendicular to an extending direction of the data line. As illustrated in FIG. 3, the method that the whole array substrate is all driven by a source driving circuit can be adopted, to implement that one source driving circuit provides driving signals to data lines of the whole array substrate. Of course, the structure as illustrated in FIG. 4 can also be adopted, and the data lines on upper and lower sides of the whole array substrate can be driven in a separate way, to implement that two source driving circuits provide driving signals to the data lines located on the upper and lower sides of the whole array substrate, respectively.

Figure 5:
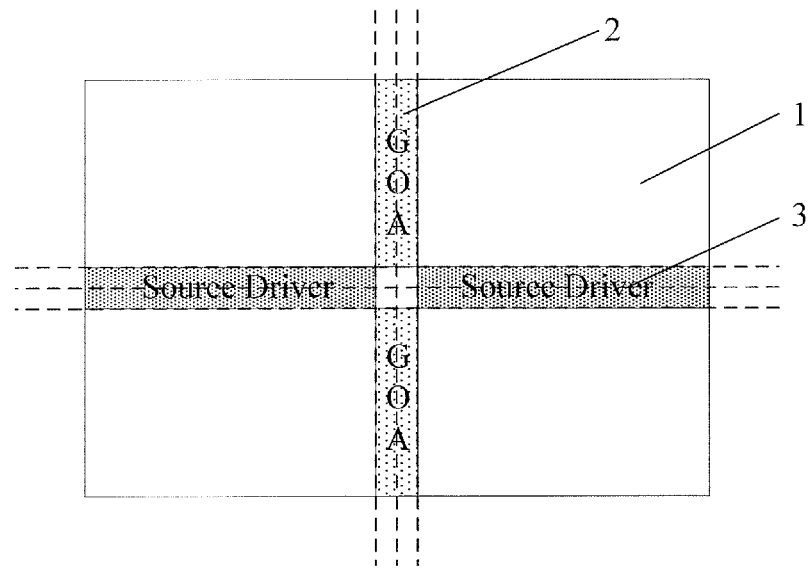
FIG. 5 is a structural schematic diagram of another array substrate provided by another embodiment of the disclosure.

In one example, as illustrated in FIG. 5, the gate driving circuit is a Gate Driver On Array (GOA); the source driving circuit is an independent source driver.

In the practical design, it can be adopted in FIG. 5 that the whole array substrate only adopts a GOA and a source driver to provide driving signals to the gate line and the data line, respectively; or adopt two GOAs to provide driving signals to the gate lines on both sides of the whole array substrate, respectively, and two source drivers to provide driving signals to the data lines on both sides of the whole array substrate. In specific applications, a suitable method can be chosen according to actual production condition, cost and demand of production.

Figure 6:
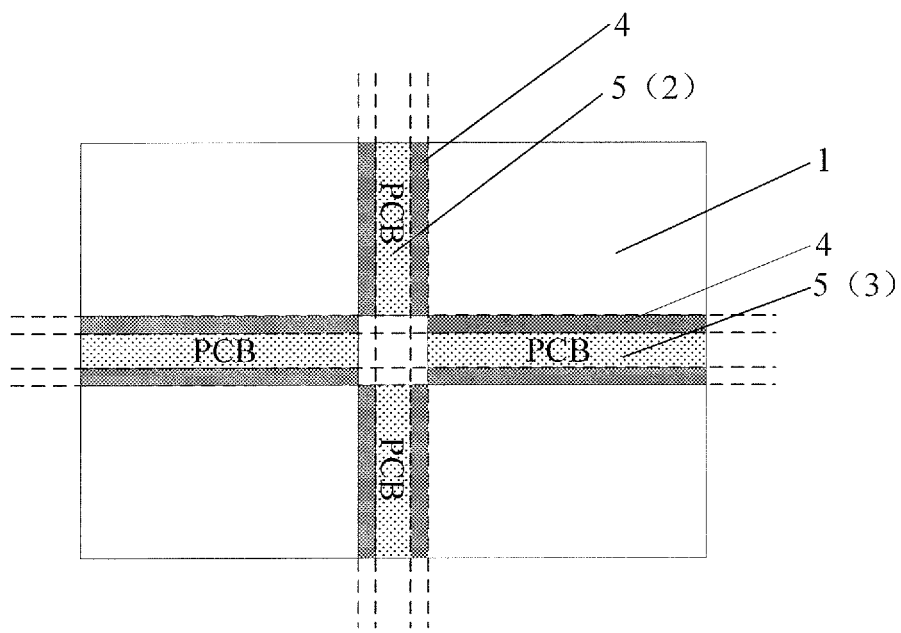
FIG. 6 is a structural schematic diagram of yet another array substrate provided by another embodiment of the disclosure.

Further optionally, referring to FIG. 6, the array substrate 1 further comprises a Chip On Film (COF) 4.

As illustrated in FIG. 6, the gate driving circuit 2 is disposed on a Printed Circuit Board (PCB) 5.

The COF 4 is disposed on a position between the PCB 5 and the array substrate 1.

The source driving circuit 3 is also disposed on the PCB 5, and meanwhile the PCB provided with the source driving circuit is connected with the array substrate 1 through the COF 4.

In the array substrate provided by the present disclosure, the source driving circuit and the gate driving circuit can also be disposed on the PCB. At this time, the PCB provided with the source driving circuit and the gate driving circuit is connected with the array substrate through the COF, to implement the function of providing driving signals to the gate line and the data line. When the display device is formed, the COF bends downwards along a position of a dotted line that each COF corresponds to in FIG. 6, so that after the display device is finally formed, the PCB is located on a surface of the whole array substrate away from a display side. Thus, the formed display device will not have the problem like non-display in the middle portion, and will not have frame. Even if, when it is necessary to make a large-sized display screen, a plurality of array substrates are spliced together to form the large-sized display screen provided by the embodiment of the disclosure, since there is no driving circuit on edges of all the array substrates, the large-sized display device finally formed will not have splicing gap, and thus the problems such as split screen and discontinuous images, will not appear.

As for the array substrate provided by the embodiment of the present disclosure, the array substrate is made of a flexible material, and the gate driving circuit is disposed on a position of a central axis of a pattern of the array substrate, so that it is not necessary to fabricate the driving circuit in the periphery region of the array substrate or fabricate a frame for the array substrate, which solves the problems such as the frame existed in the display, the split screen and discontinuous images of the large-sized display screen after splicing in the prior art, implements a frameless design of the display device, and meanwhile implements a seamless splicing of the large-sized display screen, and improves the viewing effect of users and the overall display effect of images.

An embodiment of the present disclosure provides a display device, the display device comprising the array substrate provided by the embodiment of the present disclosure, and the display device can be: any product or component having a display function, such as a mobile phone, a tablet computer, a television, a laptop computer, a digital photo frame, a navigator, etc.

In the display device provided by embodiment of the disclosure, the array substrate of the display device is made of a flexible material, and the gate driving circuit is disposed on a position of a central axis of a pattern of the array substrate, so that it is not necessary to fabricate the driving circuit in the periphery region of the array substrate or fabricate a frame for the array substrate, which solves the problems such as the frame existed in the display, the split screen and discontinuous images of the large-sized display screen after splicing in the prior art, implements a frameless design of the display device, and meanwhile implements a seamless splicing of the large-sized display screen spliced, and improves the viewing effect of users and the overall display effect of images.

Figure 7:
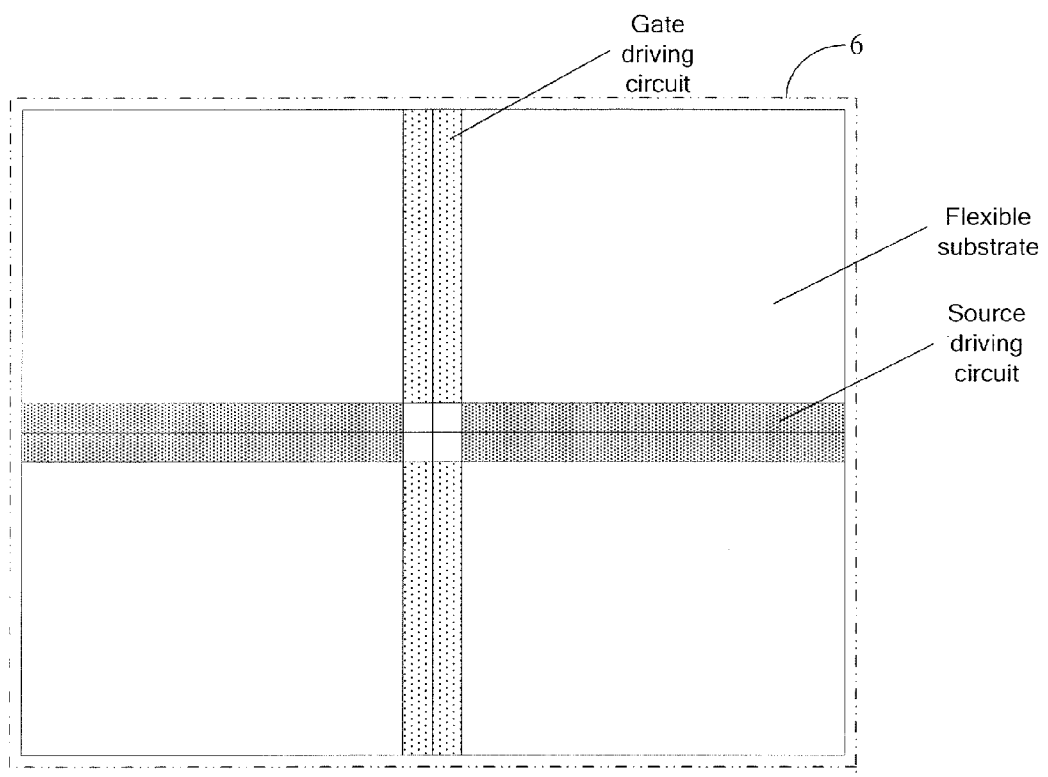
FIG. 7 is a structural schematic diagram of a display device provided by an embodiment of the disclosure.

An embodiment of the disclosure provides a display device 6, referring to FIG. 7, the display device comprising at least four array substrates spliced together, each array substrate having a gate driving circuit and a source driving circuit.

The gate driving circuit of each array substrate is disposed on a position between two array substrates and extends along edges of the array substrate on both sides of the gate driving circuit.

The source driving circuit of each array substrate is arranged to extend in a direction perpendicular to an extending direction of the gate driving circuit and is located on a position between two array substrates.

The gate driving circuit is an independent array substrate Gate Driver On Array (GOA).

The source driving circuit is an independent source driver.

Optionally, the gate driving circuit and the source driving circuit are disposed on a Printed Circuit Board (PCB), respectively.

The PCB is connected with the array substrates in the display device through a COF, respectively.

The display device provided by embodiment of the disclosure is a large-sized display device. The display device is composed of at least four array substrates, and the source driving circuit and the gate driving circuit of each array substrate are both located on a position between the two array substrates which are adjacent to that array substrate, and the structure of the display device finally formed is as illustrated in FIG. 7. The display device only needs to be spliced once, which reduces the number of splicing among array substrates, and meanwhile, the gate driving circuit and the source driving circuit of each array substrate can also bend downwards to keep the array substrates completely closed together, and the display device finally formed needs no frame fabricated, implementing the frameless large-sized display screen as well as seamless splicing, and further improving the overall display effect of the whole images.

In the display device provided by the embodiment of the present disclosure, the array substrate of the display device is made of a flexible material, and the gate driving circuit is disposed on a position of a central axis of a pattern of the array substrate, so that it is not necessary to fabricate the driving circuit in the periphery region of the array substrate or fabricate a frame for the array substrate, which solves the problems such as the frame existed in the display, the split screen and discontinuous images of the large-sized display screen after splicing in the prior art, implements a frameless design of the display without frame, and meanwhile implements a seamless splicing of the large-sized display screen spliced, and improves the viewing effect of users and the overall display effect of images.

For example, as for the array substrate or the array substrates spliced together in the display device according to the embodiments of the disclosure, a portion of the array substrate corresponding to the gate driving circuit bends toward one side of the array substrate, so that portions of the array substrate, which are located on both sides of the gate driving circuit, are in contact with each other. A portion of the array substrate corresponding to the source driving circuit bends toward one side of the array substrate, so that portions of the array substrate, which are located on both sides of the source driving circuit, are in contact with each other.

The foregoing embodiments merely are exemplary embodiments of the disclosure, and not intended to define the scope of the disclosure, and the scope of the disclosure is determined by the appended claims.

The present application claims priority of Chinese Patent Application No. 201410472219.1 filed on Sep. 16, 2014, the disclosure of which is incorporated herein by reference in its entirety as part of the present application.

The invention claimed is:

1. An array substrate, the array substrate comprising: a flexible substrate; a gate driving circuit, formed on or connected to the flexible substrate, no pixel electrode layer being provided on a position of the array substrate corresponding to the gate driving circuit, wherein, the flexible substrate is made of a flexible material, and the flexible substrate is a continuous substrate including spliced display regions and a bending portion between the spliced display regions;

the gate driving circuit is disposed on a position of a central axis of the array substrate and extends along a direction of the central axis;

the gate driving circuit is configured for providing a driving signal to a gate line of the entirety of the array substrate, wherein, a first part of the bending portion of the flexible substrate corresponding to the gate driving circuit bends toward one side of the array substrate, so that portions of the array substrate, which are located on both sides of the gate driving circuit, are in contact with each other, the first part of the bending portion of the flexible substrate and the gate driving circuit are located at a side of the spliced display regions away from their display side, wherein, the entirety of the portions of the array substrate, which are located on both sides of the gate driving circuit, are the spliced display regions.

2. The array substrate according to claim 1, wherein, the array substrate further comprises a source driving circuit connected to the flexible substrate, and no pixel electrode layer is provided on a position of the array substrate corresponding to the source driving circuit;

the source driving circuit is disposed on a position of another central axis of the array substrate, which is perpendicular to an extending direction of the gate driving circuit, and extends along a direction of the another central axis;

the source driving circuit is configured for providing a driving signal to a data line of the array substrate;

a second part of the bending portion of the flexible substrate corresponding to the source driving circuit bends toward one side of the array substrate, so that portions of the array substrate, which are located on both sides of the source driving circuit, are in contact with each other, the second part of the bending portion of the flexible substrate and the source driving circuit are located at the side of the spliced display regions away from their display side.

3. The array substrate according to claim 2, wherein, the source driving circuit is an independent source driver.

4. The array substrate according to claim 2, wherein, the array substrate further comprises a Chip On Film (COF);

the source driving circuit is disposed on a Printed Circuit Board (PCB);

the COF is disposed on a position between the PCB and the array substrate.

5. The array substrate according to claim 2, wherein, the gate driving circuit is a Gate Driver On Array (GOA).

6. The array substrate according to claim 2, wherein, the array substrate further comprises a Chip On Film (COF);

the gate driving circuit is disposed on a Printed Circuit Board (PCB);

the COF is disposed on a position between the PCB and the array substrate.

7. The array substrate according to claim 1, wherein, the gate driving circuit is a Gate Driver On Array (GOA).

8. The array substrate according to claim 1, wherein, the array substrate further comprises a Chip On Film (COF);

the gate driving circuit is disposed on a Printed Circuit Board (PCB);

the COF is disposed on a position between the PCB and the array substrate.

9. A display device, comprising the array substrate according to claim 1.

10. The display device according to claim 9, wherein, the array substrate further comprises a source driving circuit, and no pixel electrode layer is provided on a position of the array substrate corresponding to the source driving circuit;

the source driving circuit is disposed on a position of another central axis of the array substrate, which is perpendicular to an extending direction of the gate driving circuit, and extends along a direction of the another central axis;

the source driving circuit is configured for providing a driving signal to a data line of the array substrate.

11. The display device according to claim 10, wherein, the source driving circuit is an independent source driver.

12. The display device according to claim 9, wherein, the gate driving circuit is a Gate Driver On Array (GOA).

13. The display device according to claim 9, wherein, the array substrate further comprises a Chip On Film (COF);

the gate driving circuit is disposed on a Printed Circuit Board (PCB);

the COF is disposed on a position between the PCB and the array substrate.

* * * * *